(12) United States Patent
Bangsaruntip et al.

(10) Patent No.: US 8,173,993 B2
(45) Date of Patent: May 8, 2012

(54) GATE-ALL-AROUND NANOWIRE TUNNEL FIELD EFFECT TRANSISTORS

(75) Inventors: Sarunya Bangsaruntip, Yorktown Heights, NY (US); Josephine B. Chang, Yorktown Heights, NY (US); Isaac Lauer, Yorktown Heights, NY (US); Jeffrey W. Sleight, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 335 days.

(21) Appl. No.: 12/630,942

(22) Filed: Dec. 4, 2009

(65) Prior Publication Data
US 2011/0133169 A1 Jun. 9, 2011

(51) Int. Cl.
*H01L 29/12* (2006.01)
(52) U.S. Cl. .................. 257/38; 438/151; 257/E21.409
(58) Field of Classification Search .................. 257/38, 257/E21.471, 296, 368, E51.006
See application file for complete search history.

(56) References Cited

U.S. PATENT DOCUMENTS

| 4,995,001 | A | 2/1991 | Dawson et al. |
|---|---|---|---|
| 5,308,445 | A | 5/1994 | Takasu |
| 5,438,018 | A | 8/1995 | Mori et al. |
| 5,552,622 | A | 9/1996 | Kimura |
| 5,574,308 | A | 11/1996 | Mori et al. |
| 5,668,046 | A | 9/1997 | Koh et al. |
| 6,365,465 | B1 | 4/2002 | Chan et al. |
| 6,642,115 | B1 | 11/2003 | Cohen et al. |
| 6,653,209 | B1 | 11/2003 | Yamagata |
| 6,806,141 | B2 | 10/2004 | Kamins |
| 6,855,606 | B2 | 2/2005 | Chen et al. |
| 6,882,051 | B2 | 4/2005 | Majumdar et al. |
| 6,891,227 | B2 | 5/2005 | Appenzeller et al. |
| 6,903,013 | B2 | 6/2005 | Chan et al. |
| 6,996,147 | B2 | 2/2006 | Majumdar et al. |
| 7,101,762 | B2 | 9/2006 | Cohen et al. |

(Continued)

FOREIGN PATENT DOCUMENTS
EP 217811 A1 4/2010
(Continued)

OTHER PUBLICATIONS

Andriotis et al., Realistic nanotube-metal contact configuration for molecular electronics applications, IEEE Sensors Journal, vol. 8, No. 6, Jun. 2008.

(Continued)

*Primary Examiner* — Roy Potter
(74) *Attorney, Agent, or Firm* — Cantor Colburn LLP; Vazken Alexanian

(57) ABSTRACT

A method for forming a nanowire tunnel field effect transistor (FET) device includes forming a nanowire suspended by first and second pad regions over a semiconductor substrate, the nanowire including a core portion and a dielectric layer, forming a gate structure around a portion of the dielectric layer, forming a first spacer around portions of the nanowire extending from the gate structure, implanting ions in a first portion of the nanowire, implanting ions in the dielectric layer of a second portion of the nanowire, removing the dielectric layer from the second portion of the nanowire, removing the core portion of the second portion of the exposed nanowire to form a cavity, and epitaxially growing a doped semiconductor material in the cavity from exposed cross sections of the nanowire and the second pad region to connect the exposed cross sections of the nanowire to the second pad region.

27 Claims, 7 Drawing Sheets

U.S. PATENT DOCUMENTS

| | | | |
|---|---|---|---|
| 7,151,209 B2 | 12/2006 | Empedocles et al. | |
| 7,180,107 B2 | 2/2007 | Appenzeller et al. | |
| 7,253,060 B2 | 8/2007 | Yun et al. | |
| 7,297,615 B2 | 11/2007 | Cho et al. | |
| 7,311,776 B2 | 12/2007 | Lin et al. | |
| 7,443,025 B2 | 10/2008 | Verbist | |
| 7,446,025 B2 | 11/2008 | Cohen et al. | |
| 7,449,373 B2 | 11/2008 | Doyle et al. | |
| 7,452,778 B2 | 11/2008 | Chen et al. | |
| 7,456,068 B2 | 11/2008 | Kavalieros et al. | |
| 7,456,476 B2 | 11/2008 | Hareland et al. | |
| 7,473,943 B2 * | 1/2009 | Mostarshed et al. | 257/213 |
| 7,498,211 B2 | 3/2009 | Ban et al. | |
| 7,550,333 B2 | 6/2009 | Shah et al. | |
| 7,569,941 B2 | 8/2009 | Majumdar et al. | |
| 7,642,578 B2 | 1/2010 | Lee et al. | |
| 7,791,144 B2 | 9/2010 | Chidambarrao et al. | |
| 7,799,657 B2 | 9/2010 | Dao | |
| 7,803,675 B2 | 9/2010 | Suk et al. | |
| 7,834,345 B2 | 11/2010 | Bhuwalka et al. | |
| 7,871,870 B2 * | 1/2011 | Mostarshed et al. | 438/151 |
| 7,893,506 B2 | 2/2011 | Chau et al. | |
| 2004/0149978 A1 | 8/2004 | Snider | |
| 2004/0166642 A1 | 8/2004 | Chen et al. | |
| 2005/0121706 A1 | 6/2005 | Chen et al. | |
| 2005/0266645 A1 | 12/2005 | Park | |
| 2005/0275010 A1 | 12/2005 | Chen et al. | |
| 2006/0033145 A1 | 2/2006 | Kakoschke et al. | |
| 2007/0001219 A1 | 1/2007 | Radosavljevic et al. | |
| 2007/0267619 A1 | 11/2007 | Nirschl | |
| 2007/0267703 A1 | 11/2007 | Chong et al. | |
| 2007/0284613 A1 | 12/2007 | Chui et al. | |
| 2008/0014689 A1 | 1/2008 | Cleavelin et al. | |
| 2008/0061284 A1 | 3/2008 | Chu et al. | |
| 2008/0067495 A1 | 3/2008 | Verhulst | |
| 2008/0067607 A1 | 3/2008 | Verhulst et al. | |
| 2008/0079041 A1 | 4/2008 | Suk et al. | |
| 2008/0121932 A1 | 5/2008 | Ranade | |
| 2008/0135949 A1 | 6/2008 | Lo et al. | |
| 2008/0142853 A1 | 6/2008 | Orlowski | |
| 2008/0149914 A1 | 6/2008 | Samuelson et al. | |
| 2008/0149997 A1 | 6/2008 | Jin et al. | |
| 2008/0150025 A1 | 6/2008 | Jain | |
| 2008/0179752 A1 | 7/2008 | Yamauchi et al. | |
| 2008/0191196 A1 | 8/2008 | Lu et al. | |
| 2008/0224224 A1 | 9/2008 | Vandenderghe et al. | |
| 2008/0227259 A1 | 9/2008 | Avouris et al. | |
| 2008/0246021 A1 | 10/2008 | Suk et al. | |
| 2008/0247226 A1 | 10/2008 | Liu et al. | |
| 2008/0290418 A1 | 11/2008 | Kalburge | |
| 2009/0026553 A1 | 1/2009 | Bhuwalka et al. | |
| 2009/0057650 A1 | 3/2009 | Lieber et al. | |
| 2009/0057762 A1 | 3/2009 | Bangsaruntip et al. | |
| 2009/0061568 A1 | 3/2009 | Bangsaruntip et al. | |
| 2009/0090934 A1 | 4/2009 | Tezuka et al. | |
| 2009/0134467 A1 | 5/2009 | Ishida et al. | |
| 2009/0149012 A1 | 6/2009 | Brask et al. | |
| 2009/0181477 A1 | 7/2009 | King et al. | |
| 2009/0294864 A1 | 12/2009 | Suk et al. | |

FOREIGN PATENT DOCUMENTS

| | | |
|---|---|---|
| KR | 20090044799 A | 5/2009 |
| WO | 02084757 A1 | 10/2002 |
| WO | WO2008069765 A1 | 6/2008 |

OTHER PUBLICATIONS

R, Bahar, 'Trends and Future Directions in Nano Structure Based Computing and Fabrication', ICCD 2006, International Conf. on Computer Design, Oct. 1-4, 2007, pp. 522-527.

Buddharaju et al., 'Gate-All-Around Si-Nanowire CMOS Inverter Logic Fabricated Using Top-Down Approach', European Solid-State Device Research Conference, Sep. 11, 2007, pp. 303-306.

Chen et al., 'Demonstration of Tunneling FETs Based on Highly Scalable Verticle Silicon Nanowires', IEEE Electron Device Letters, vol. 30, No. 7, Jul. 2009, pp. 754-756.

Hu et al., 'Fringing field effects on electrical resistivity of semiconductor nanowire-metal contacts', Applied Physics Letters 92, 083503_2008.

Jie Xiang et al., "Ge/Si Nanowire Heterostructures as High-Performance Field-Effect Transistors," Nature 441, 489-493 (May 25, 2006).

Knoch et al., 'Tunneling phenomena in carbon nanotube field-effect transistors', Phys Stat Sol. (a) 205, No. 4, 679-694 (2008).

Leonard et ai., 'Size-dependent effects on electrical contacts to nanotubes and nanowires', Phys Rev Lett., Jul. 14, 2006; 97(2):026804.

M. T. Bjork et al., "Silicon Nanowire Tunneling Field-Effect Transistors," Applied Physics Letters 92, 193504 (2008).

Ma et al., 'High-performance nanowire complementary metal-semiconductor inverters', Applied Physics Letters 93, 053105_2008.

Saumitra Raj mehrotra, A Simulation Study of Silicom Nanowire Field Effect Transistors (FETs), University of Cincinnati, Jul. 2007.

Lauhon et al., 'Epitaxial core-shell and core-multishell nanowire heterostructures', Nature, vol. 420, Nov. 7, 2002, pp. 57-61.

Singh et al., 'Si, SiGe Nanowire Devices by Top-Down Technology and Their Applications', IEEE Transactions On Electron Devices, vol. 55, No. 11, Nov. 2008, pp. 3107-3118.

Taichi Su et al., New Planar Self-Aligned Double-Gate Fully Depleted P-MOSFET's Using Epitaxial Lateral Overgrowth (ELO) and Selectively Grown Source/Drain (S/D).

N. Checka, 'Circuit Architecture for 3D Integration', Chapter 13 in Wafer Level 3-D ICs Process Technology, ed. C.S. Tan, Springer US, 2008, ISBN 978-0-387-76534-1.

Alexander J. Gates, "Designing a Nanoelectronic Circuit to Control a Millimeter-scale Walking Robot," Mitre Technical Paper, Aug. 2004, http://www.mitre.org/work/tech_papers/tech_papers_04/04_1248/04_1248.pdf.

Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008. Jun. 2-4, 2008 pp. 265-268.

M. M. Ziegler et al., "The CMOS/NANO Interface from a Circuits Perspective," ISCAS '03. Proceedings of the 2003 International Symposium on Circuits and Systems, May 25-28, 2003, vol. 4, pp. IV-904-IV-907.

Alexander J. Gates, "Designing a Nanoelectronic Circuit to Control a Millimeter-scale Walking Robot," Mitre Technical Paper, Nov. 2004, http://www.mitre.org/work/tech_papers/tech_papers_04/04_1248/04_1248.pdf.

International Search Report; International Application No. PCT/US2011/029304; International Filing Date: Mar. 22, 2011; Date of Mailing: May 20, 2011.

International Search Report—Written Opinion; International Application No. PCT/US2011/029304; International Filing Date: Mar. 22, 2011; Date of Mailing: May 20, 2011.

International Search Report; International Application No. PCT/EP2011/053174; International Filing Date: Mar. 3, 2011; Date of Mailing: May 31, 2011.

International Search Report—Written Opinion; International Application No. PCT/EP2011/053174; International Filing Date: Mar. 3, 2011; Date of Mailing: May 31, 2011.

G.W. Neudeck, "An Overview of Double-Gate MOSFETs," Proceedings of 15th Biennial University/Government/Industry Microelectronics Symposium. UGIM 2003. New York, NY: IEEE, US, Jun. 30-Jul. 2, 2003., Jun. 30, 2003, pp. 214-217.

International Search Report; International Application No. PCT/EP2010/066961; International Filing Date: Nov. 8, 2010; Date of Mailing: Feb. 10, 2011.

International Search Report; International Application No. PCT/EP2010/066483; International Filing Date: Oct. 29, 2010; Date of Mailing: Feb. 7, 2011.

International Search Report—Written Opinion; International Application No. PCT/EP2010/066483; International Filing Date: Oct. 29, 2010; Date of Mailing: Feb. 7, 2011.

International Search Report—Written Opinion; International Application No. PCT/EP2010/066961; International Filing Date: Nov. 8, 2010; Date of Mailing: Feb. 10, 2011.

Pavanello et al., "Evaluation of Triple-Gate FinFETs With SiO2-HfO2-TiN Gate Stack Under Analog Operation," Solid State Electronics, Elsevier Science Publishers, Barking, GB, vol. 51, No. 2, Mar. 7, 2007, pp. 285-291.

* cited by examiner

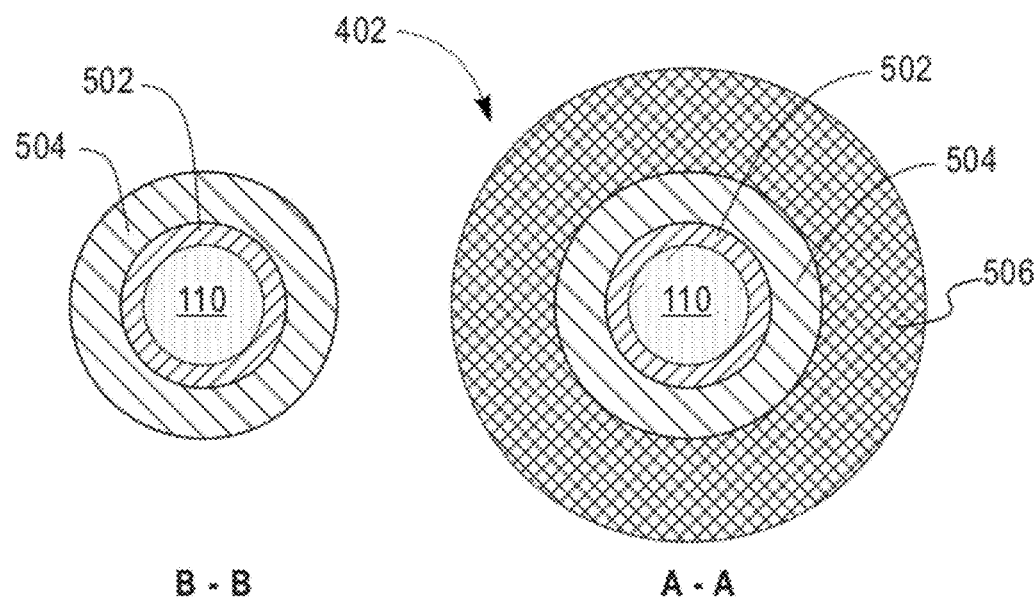
B - B
FIG. 5B
A - A
FIG. 5A
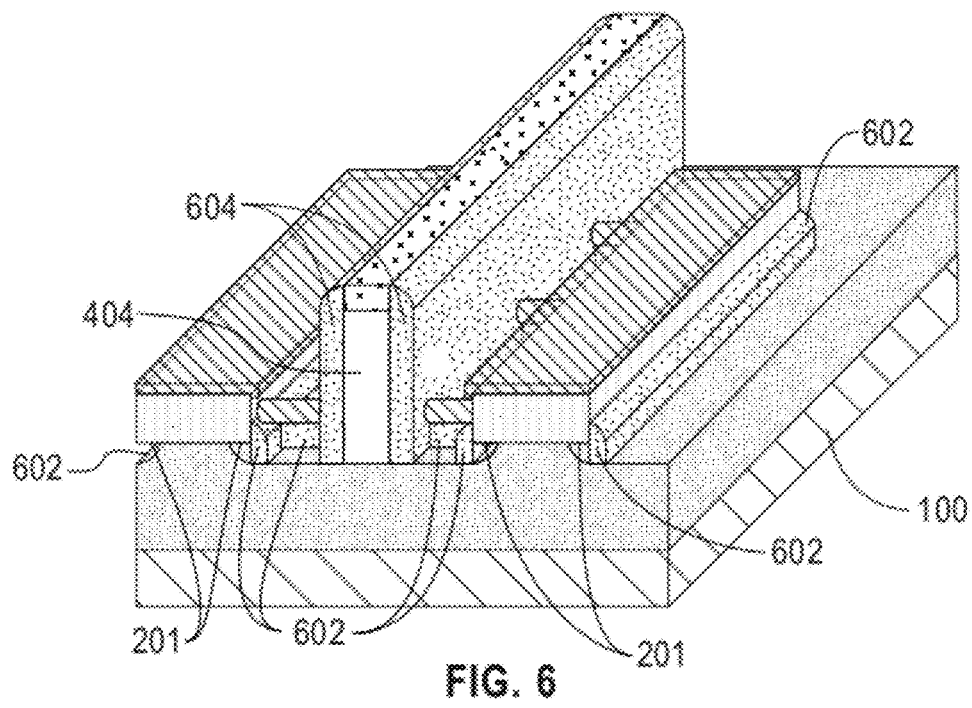
FIG. 6

GATE-ALL-AROUND NANOWIRE TUNNEL FIELD EFFECT TRANSISTORS

CROSS REFERENCE TO RELATED APPLICATIONS

This application is related to co-pending application Ser. No. 12/631,199, Ser. No. 12/631,205, Ser. No. 12/630,939, Ser. No. 12/631,213, Ser. No. 12/631,342, all of which are incorporated by reference herein.

FIELD OF INVENTION

The present invention relates to semiconductor nanowire tunnel field effect transistors.

DESCRIPTION OF RELATED ART

A nanowire tunnel field effect transistor (FET) includes doped portions of nanowire that contact the channel region and serve as source and drain regions of the device. Previous fabrication methods that used ion-implantation to dope the small diameter nanowire may result in undesirable amorphization of the nanowire or an undesirable junction doping profile.

BRIEF SUMMARY

In one aspect of the present invention, a method for forming a nanowire tunnel field effect transistor (FET) device includes forming a nanowire suspended by a first pad region and a second pad region over a semiconductor substrate, the nanowire including a core portion and a dielectric layer around the core portion, forming a gate structure around a portion of the dielectric layer, forming a first protective spacer adjacent to sidewalls of the gate structure and around portions of the nanowire extending from the gate structure, implanting a first type of ions in a first portion of the exposed nanowire, implanting a second type of ions in the dielectric layer of a second portion of the exposed nanowire, removing the dielectric layer from the second portion of the exposed nanowire to reveal the core portion of the second portion of the exposed nanowire, removing the core portion of the second portion of the exposed nanowire to form a cavity defined by the core portion of the nanowire surrounded by the gate structure and the spacer, and epitaxially growing a doped semiconductor material in the cavity from exposed cross sections of the nanowire and the second pad region to connect the exposed cross sections of the nanowire to the second pad region.

In another aspect of the present invention, a nanowire tunnel field effect transistor (FET) device includes a channel region including a silicon portion having a first distal end and a second distal end, the silicon portion is surrounded by a gate structure disposed circumferentially around the silicon portion, a drain region including an n-type doped silicon portion extending from the first distal end, a cavity defined by the second distal end of the silicon portion and an inner diameter of the gate structure, a source region including a doped epi-silicon nanowire extension epitaxially extending from the second distal end of the silicon portion in the cavity.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-13 illustrate an exemplary method for forming a tunnel field effect transistor (FET) device.

DETAILED DESCRIPTION

Figure 1:
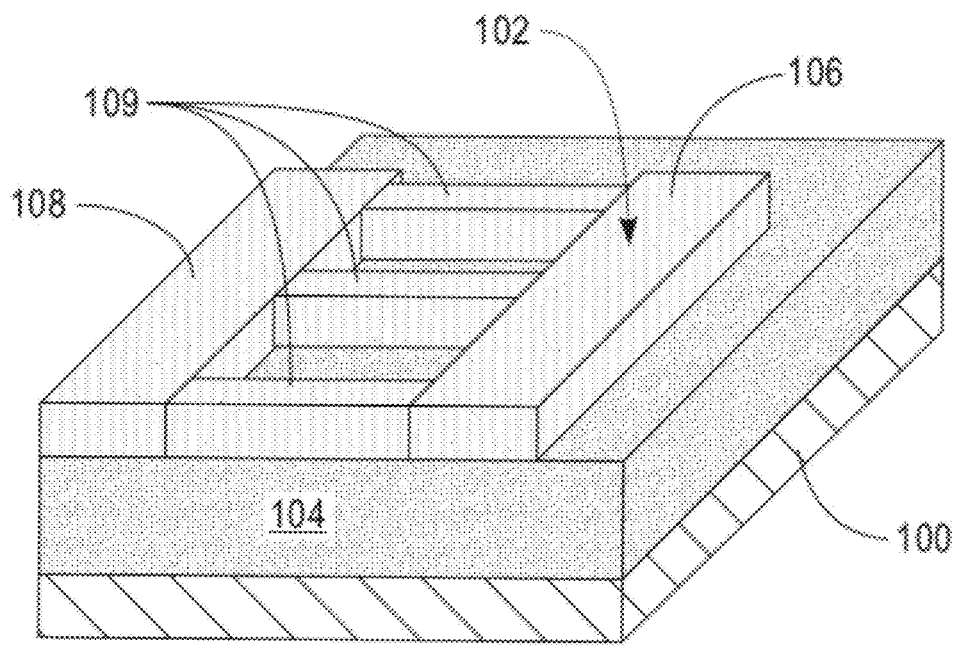

With reference now to FIG. 1, a silicon on insulator (SOI) portion 102 is defined on a buried oxide (BOX) layer 104 that is disposed on a silicon substrate 100. The SOI portion 102 includes a SOI pad region 106, a SOI pad region 108, and nanowire portions 109. The SOI portion 102 may be patterned by the use of lithography followed by an etching process such as, for example, reactive ion etching (RIE).

Figure 2:
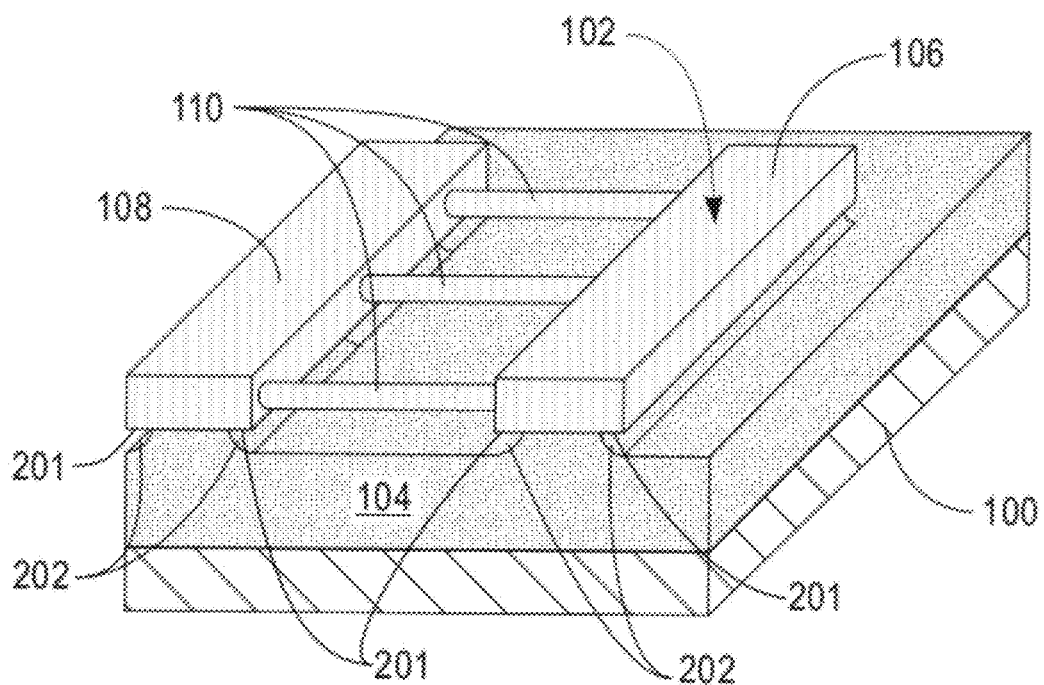

FIG. 2 illustrates the resultant BOX layer 104 and SOI portion 102 following an isotropic etching process. The BOX layer 104 is recessed in regions not covered by SOI portion 102. The isotropic etching results in the lateral etching of portions of the BOX layer 104 that are under the SOI portion 102. The lateral etch suspends the nanowires 109 above the BOX layer 104. The lateral etch forms the undercuts 202 in the BOX layer 104 and overhang portions 201 at the edges of SOI regions 106 and 108. The isotropic etching of the BOX layer 104 may be, for example, performed using a diluted hydrofluoric acid (DHF). A 100:1 DHF etches about 2 to 3 nm of BOX layer 104 per minute at room temperature. Following the isotropic etching the nanowires portions 109 are smoothed to form elliptical shaped (and in some cases, cylindrical shaped) nanowires 110 that are suspended above the BOX layer 104 by the SOI pad region 106 and the SOI pad region 108. The smoothing of the nanowires may be performed by, for example, annealing of the nanowires 109 in hydrogen. Example annealing temperatures may be in the range of 600° C.-900° C., and a hydrogen pressure of approximately 600 torr to 7 torr.

Figure 3:
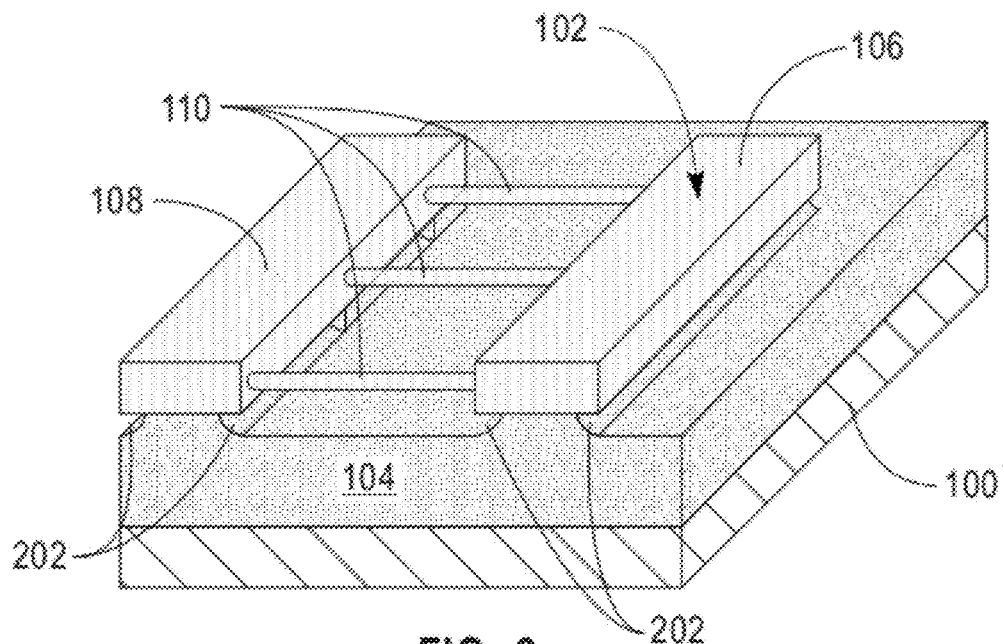

FIG. 3 illustrates the nanowires 110 following an oxidation process that reduces the diameter of the nanowires 110. The reduction of the diameter of the nanowires 110 may be performed by, for example, an oxidation of the nanowires 110 followed by the etching of the grown oxide. The oxidation and etching process may be repeated to achieve a desired nanowire 110 diameter. Once the diameters of the nanowires 110 have been reduced, gates are formed over the channel regions of the nanowires 110 (described below).

Figure 4:
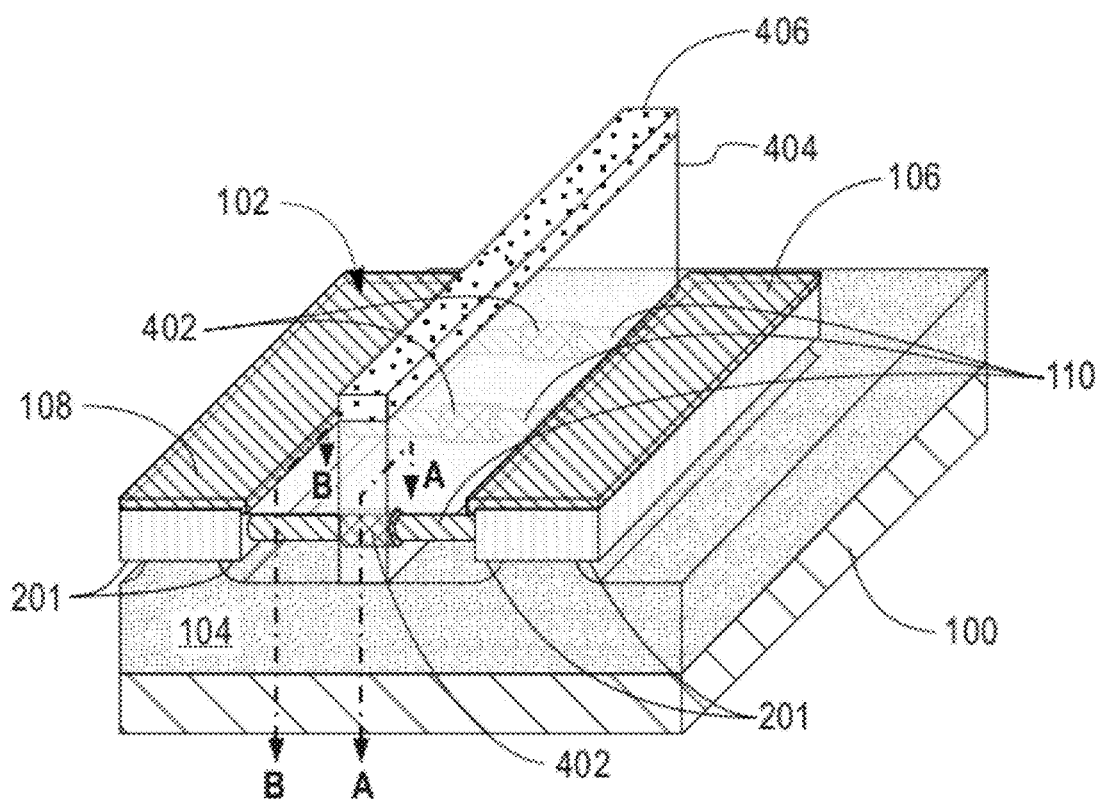

FIG. 4 illustrates gates 402 that are formed around the nanowires 110, as described in further detail below, and capped with a polysilicon layer (capping layer) 404. A hardmask layer 406, such as, for example silicon nitride ($Si_3N_4$) is deposited over the polysilicon layer 404. The polysilicon layer 404 and the hardmask layer 406 may be formed by depositing polysilicon material over the BOX layer 104 and the SOI portion 102, depositing the hardmask material over the polysilicon material, and etching by RIE to form the polysilicon layer 406 and the hardmask layer 404. The etching of the gate 402 may be performed by directional etching that results in straight sidewalls of the gate 402. Following the directional etching, polysilicon 404 remains under the nanowires 110 and outside the region encapsulated by the gate 402. Isotropic etching may be performed to remove polysilicon 404 from under the nanowires 110.

FIG. 5A illustrates a cross sectional view of a gate 402 along the line A-A (of FIG. 4). The gate 402 is formed by depositing a first gate dielectric layer (high K layer) 502, such as silicon dioxide ($SiO_2$) around the nanowire 110, and the SOI pad regions 106 and 108. A second gate dielectric layer (high K layer) 504 such as, for example, hafnium oxide ($HfO_2$) is formed around the first gate dielectric layer 502. A metal layer 506 such as, for example, tantalum nitride (TaN) is formed around the second gate dielectric layer 504. The metal layer 506 is surrounded by polysilicon layer 404 (of FIG. 4A). Doping the polysilicon layer 404 with impurities such as boron (p-type), or phosphorus (n-type) makes the polysilicon layer 404 conductive. The metal layer 506 is removed by an etching process such as, for example, RIE from the nanowire 110 that is outside of the channel region and the SOI pad regions 106 and 108, and results in the gate 402 and nanowire 110 having the first gate dielectric layer (high K layer) 502, around the nanowire 110 and the second gate dielectric layer (high K layer) 504 formed around the first gate dielectric layer 502. FIG. 5B illustrates a cross sectional view of a portion of the nanowire 110 along the line B-B (of FIG. 4).

FIG. 6 illustrates the spacer portions 604 formed along opposing sides of the polysilicon layer 404. The spacers are formed by depositing a blanket dielectric film such as silicon nitride and etching the dielectric film from all horizontal surfaces by RIE. The spacer walls 604 are formed around portions of the nanowire 110 that extend from the polysilicon layer 404 and surround portions of the nanowires 110. FIG. 6 includes spacer portions 602 that are formed under the nanowires 110, and in the undercut regions 202 (of FIG. 2).

Figure 7:
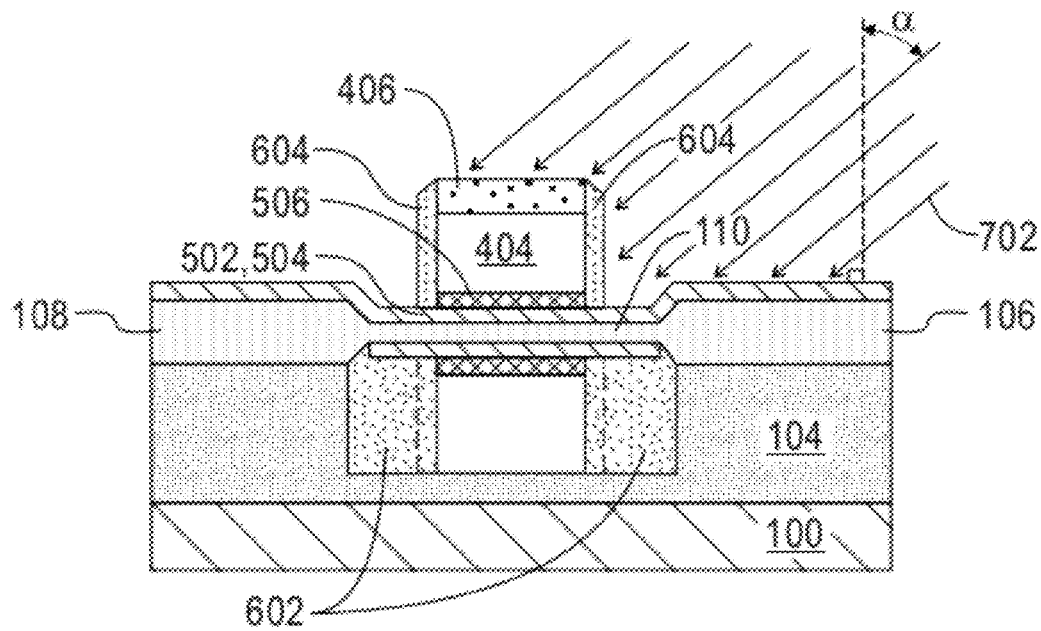

FIG. 7 illustrates a cross-sectional view of FIG. 6 following the formation of the spacers 604. In the illustrated embodiment, the exposed dielectric layers 502 and 504 on one side of the device are doped with n-type ions 702 that are implanted at an angle (a), the angle α may, for example, range from 5-50 degrees. The implantation of the n-type ions 702 at the angle α exposes one side of the device to the n-type ions 702, while the opposing side remains unexposed due to the height and position of the polysilicon layer 404. Once the ions 702 are implanted, an annealing process is performed to overlap the device. The annealing process results in a shallow doping gradient of n-type ions in the channel region of the device.

Figure 8:
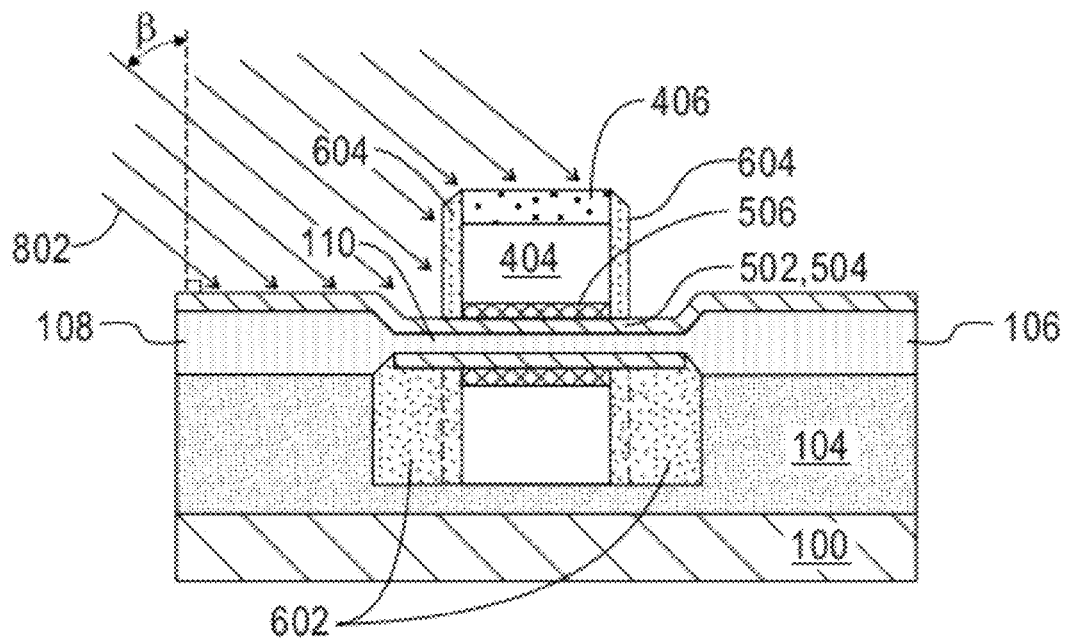

FIG. 8 illustrates a cross-sectional view of the device. In the illustrated embodiment the exposed dielectric layers 502 and 504 on the opposing side of the device (the un-doped side) is implanted with ions 802 at an angle (β). The ions 802 may include, for example, germanium, argon, or xenon. The implantation of the ions 802 at the angle β in the dielectric layers 502 and 504 damages the dielectric layers dielectric layers 502 and 504 on the un-doped side of the device, while the doped side of the device remains unexposed to the ions 802.

Figure 9:
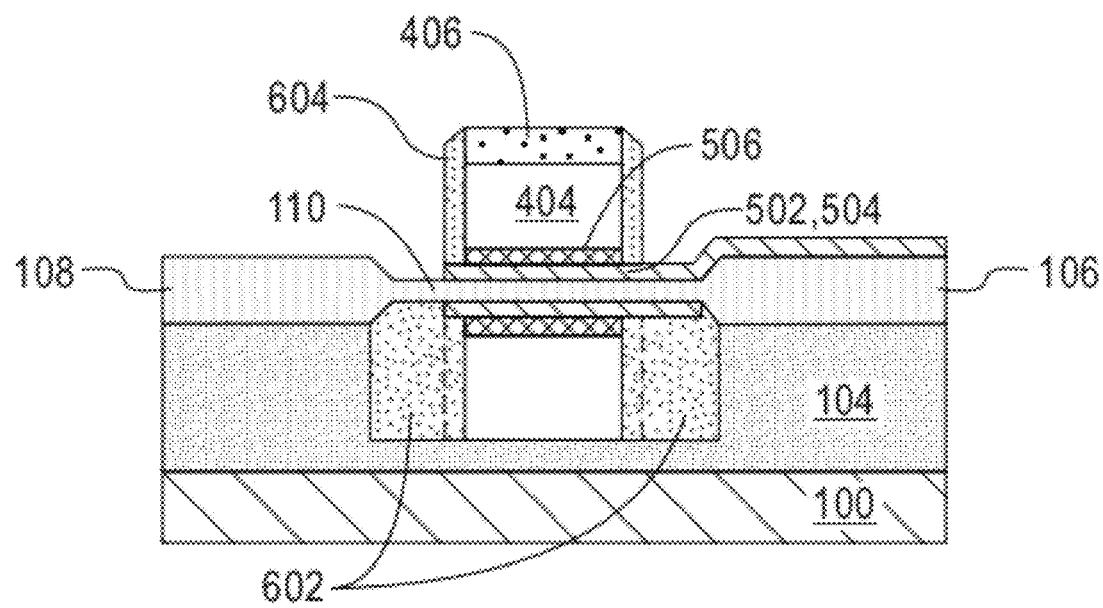

FIG. 9 illustrates a cross-sectional view of the resultant structure following a wet etching process such as, for example, a HF chemical etch that removes the damaged dielectric layers 502 and 504 that were implanted with the ions 802 (of FIG. 8) from the nanowire 110. The n-type doped dielectric layers 502 and 505 remain on the nanowire 110.

Figure 10:
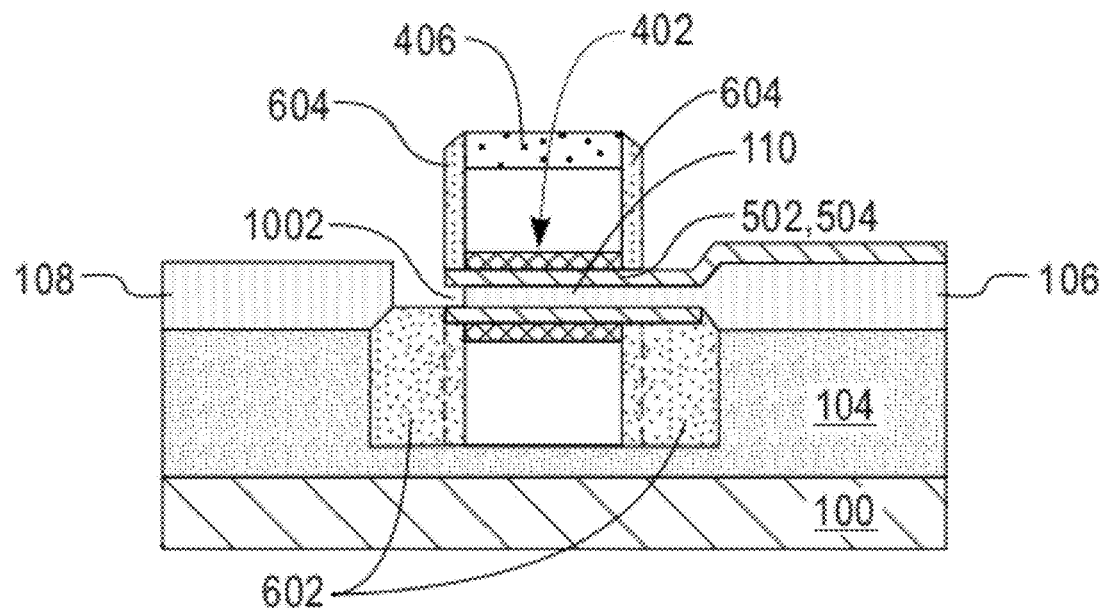

FIG. 10 illustrates a cross-sectional view of the resultant structure following an etching process, such as, for example, a wet chemical or vapor etching process that etches exposed silicon, and removes the exposed silicon nanowire 110. The etching process removes a portion of the nanowire 110 that is surrounded by the spacer wall 604 and the gate 402 to recess the nanowires 110 into the gates 402, and form a cavity 1002 defined by the gate 402, the nanowire 110 and the spacer wall 604.

The lateral etching process that forms cavity 1002 may be time based. Width variation in spacer 604 may lead to variations in the position of the edges of the recessed nanowire 110. The etching rate in the cavity 1002 depends on the size of the cavity, with narrower orifice corresponding to slower etch rates. Variations in the nanowire size will therefore lead to variations in the depth of cavity 1002.

Figure 11:
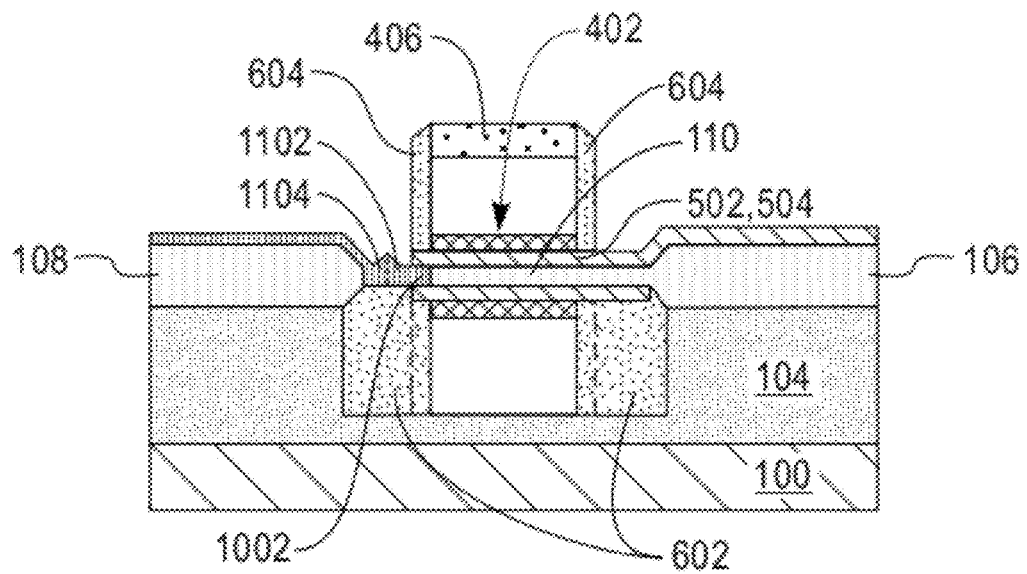

FIG. 11 illustrates cross-sectional views of the resultant structures following a selective epi-silicon growth to form nanowire extensions 1102 and 1104. The nanowire extension 1102 is epitaxially grown in the cavity 1022 (of FIG. 10) from the exposed nanowire 110 in the gate 402 to form the nanowire extension 1102. The nanowire extension 1104 is epitaxially grown from the SOI pad region 108. The nanowire extensions 1102 and 1104 are grown until they meet to connect the SOI pad region 108 to the nanowire 110 in the channel region of the gate 402. The nanowire extensions 1102 and 1104 are formed by epitaxially growing, for example, in-situ doped silicon (Si), a silicon germanium (SiGe), or germanium (Ge) that may be either n-type or p-type doped. As an example, a chemical vapor deposition (CVD) reactor may be used to perform the epitaxial growth. Precursors for silicon epitaxy include $SiCl_4$, $SiH_4$ combined with HCL. The use of chlorine allows selective deposition of silicon only on exposed silicon surfaces. A precursor for SiGe may be $GeH_4$, which may obtain deposition selectivity without HCL. Precursors for dopants may include $PH_3$ or $AsH_3$ for n-type doping and $B_2H_6$ for p-type doping. Deposition temperatures may range from 550° C. to 1000° C. for pure silicon deposition, and as low as 300° C. for pure Ge deposition.

Once epi-nanowire extensions 1102 and 1104 are formed, the doping may be activated by, for example, a laser or flash anneal process. The laser or flash annealing may reduce diffusion of ions into the channel region 1105 of the gate 402, and result in a high uniform concentration of doping in the epi-nanowire extensions 1102 and 1104 with an abrupt junction in the nanowires 110.

Figure 12:
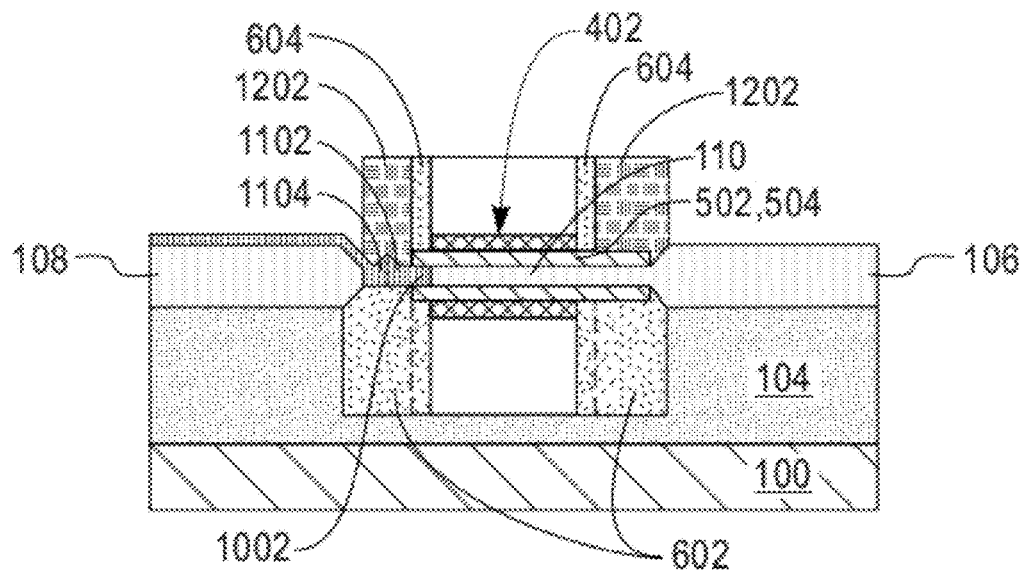

FIG. 12 illustrates a cross-sectional view of the structure following the formation of a spacer 1202. The spacer 1202 is formed by depositing a layer of spacer material such as, for example, silicon nitride or silicon dioxide and etching the spacer material using, for example, RIE to form the spacers 1202. The hardmask layer 406 may also be removed in the RIE process.

Figure 13:
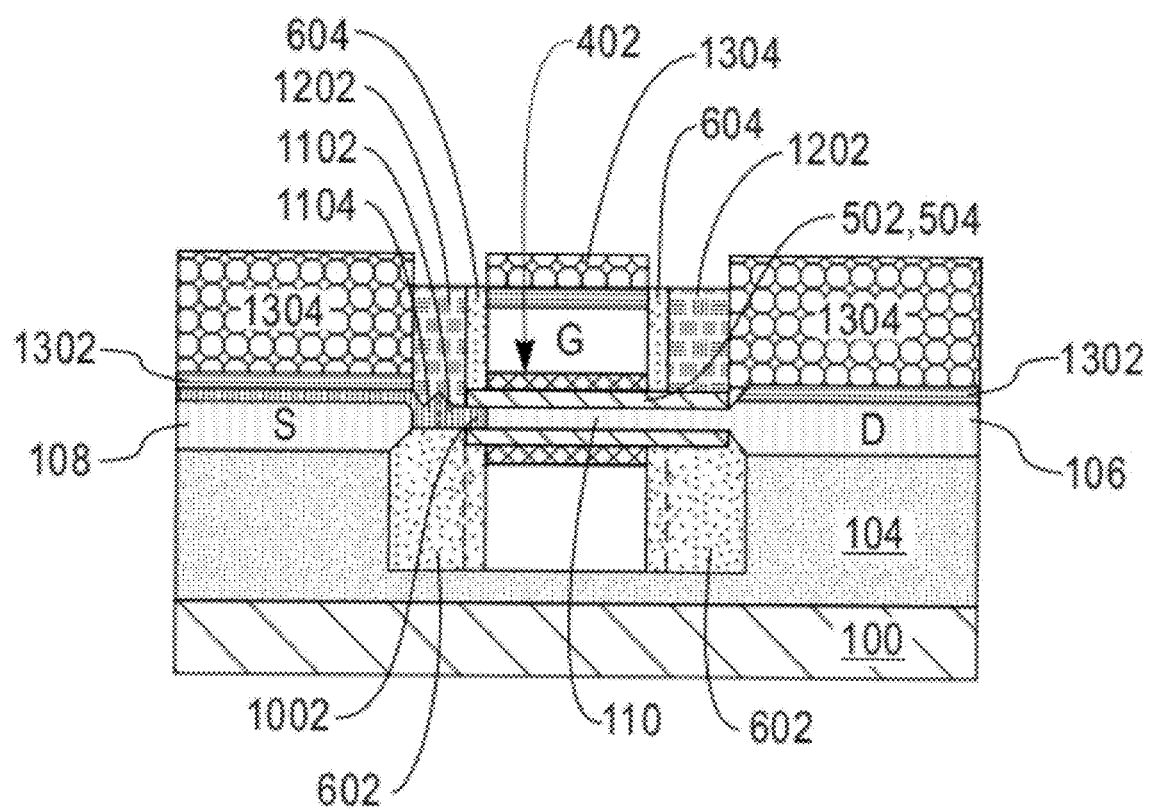

FIG. 13 illustrates the resultant structure following silicidation where a silicide 1302 is formed on the SOI pad region 106 (the drain region D) and the SOI pad region 108 (the source region S), and over the polysilicon layer 404 (the gate region G). Examples of silicide forming metals include Ni, Pt, Co, and alloys such as NiPt. When Ni is used the NiSi phase is formed due to its low resistivity. For example, formation temperatures include 400-600° C. Once the silicidation process is performed, capping layers and vias for connectivity (not shown) may be formed and a conductive material such as, Al, Au, Cu, or Ag may be deposited to form contacts 1304.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a nanowire tunnel field effect transistor (FET) device, the method comprising:
    forming a nanowire suspended by a first pad region and a second pad region over a semiconductor substrate, the nanowire including a core portion and a dielectric layer around the core portion;
    forming a gate structure around a portion of the dielectric layer;
    forming a first protective spacer adjacent to sidewalls of the gate structure and around portions of the nanowire extending from the gate structure;
    implanting a first type of ions in a first portion of the exposed nanowire;
    implanting a second type of ions in the dielectric layer of a second portion of the exposed nanowire;
    removing the dielectric layer from the second portion of the exposed nanowire to reveal the core portion of the second portion of the exposed nanowire;
    removing the core portion of the second portion of the exposed nanowire to form a cavity defined by the core portion of the nanowire surrounded by the gate structure and the spacer; and
    epitaxially growing a doped semiconductor material in the cavity from exposed cross sections of the nanowire and the second pad region to connect the exposed cross sections of the nanowire to the second pad region.

2. The method of claim 1, wherein the method further includes forming a protective spacer material over the epitaxially grown doped semiconductor material and the first portion of the exposed nanowire.

3. The method of claim 1, wherein the method further includes forming a silicide material on the first pad region, the second pad region, and the gate structure.

4. The method of claim 3, wherein the method further includes forming conductive contacts on the first pad region, the second pad region, and the gate structure.

5. The method of claim 1, wherein the core portion of the nanowire includes silicon.

6. The method of claim 1, wherein the dielectric layer includes a first dielectric material formed around the nanowire and a second dielectric material formed around the first dielectric material.

7. The method of claim 1, wherein the first type of ions are n-type ions.

8. The method of claim 1, wherein the first type of ions are implanted at an angle ($\alpha$).

9. The method of claim 8, wherein the angle $\alpha$ is between 5 and 50 degrees relative to a normal line from the semiconductor substrate.

10. The method of claim 1, wherein the second type of ions are operative to damage the dielectric layer of the second portion of the exposed nanowire.

11. The method of claim 1, wherein the second type of ions are implanted at an angle ($\beta$).

12. The method of claim 11, wherein the angle $\beta$ is between 5 and 50 degrees relative to a normal line from the semiconductor substrate.

13. The method of claim 1, wherein the method further includes forming a silicide layer on the epitaxially growing a doped semiconductor material.

14. The method of claim 1, wherein the epitaxially grown doped semiconductor material is silicon.

15. The method of claim 1, wherein the epitaxially grown doped semiconductor material is a SiGe alloy.

16. The method of claim 1, wherein the epitaxially grown doped semiconductor material is Ge.

17. The method of claim 1, wherein the first gate structure includes a silicon oxide layer disposed on a channel portion of the nanowire, a dielectric layer disposed on the silicon oxide layer, and a metal layer disposed on the dielectric layer.

18. The method of claim 1, wherein the protective spacer includes a nitride material.

19. The method of claim 1, wherein the epitaxially grown doped semiconductor material is an in-situ doped material.

20. The method of claim 1, wherein the method further comprises heating the device to diffuse dopants from the doped semiconductor material into portions of the nanowire.

21. A nanowire tunnel field effect transistor (FET) device, comprising:
    a channel region including a silicon portion having a first distal end and a second distal end, the silicon portion is surrounded by a gate structure disposed circumferentially around the silicon portion;
    a drain region including an n-type doped silicon portion extending from the first distal end;
    a cavity defined by the second distal end of the silicon portion and an inner diameter of the gate structure;
    a source region including a doped epi-silicon nanowire extension epitaxially extending from the second distal end of the silicon portion in the cavity.

22. The device of claim 21, wherein the n-type doped silicon portion is connected to a first pad region.

23. The device of claim 21, wherein the doped epi-silicon nanowire extension is connected to a second pad region.

24. The device of claim 22, wherein the first pad region includes a silicide material.

25. The device of claim 23, wherein the second pad region includes a silicide material.

26. The device of claim 21, wherein the epi-silicon nanowire extension fills the cavity.

27. The device of claim 21, wherein the epi-silicon nanowire extension is uniformly doped.

\* \* \* \* \*